(12) United States Patent
Igarashi et al.

(10) Patent No.: US 10,176,985 B2
(45) Date of Patent: Jan. 8, 2019

(54) METHOD OF MANUFACTURING LIGHT EMITTING DEVICE

(71) Applicants: NICHIA CORPORATION, Anan-shi, Tokushima (JP); Mtek-smart Corporation, Yokohama-shi, Kanagawa (JP)

(72) Inventors: Takayuki Igarashi, Yokohama (JP); Masafumi Matsunaga, Yokohama (JP)

(73) Assignees: NICHIA CORPORATION, Anan-Shi (JP); MTEK-SMART CORPORATION, Yokohama-Shi (JP)

( * ) Notice: Subject to any disclaimer, the term of this patent is extended or adjusted under 35 U.S.C. 154(b) by 0 days.

(21) Appl. No.: 15/854,517

(22) Filed: Dec. 26, 2017

(65) Prior Publication Data

US 2018/0182937 A1  Jun. 28, 2018

(30) Foreign Application Priority Data

Dec. 27, 2016 (JP) .................. 2016-254345

(51) Int. Cl.
*H01L 33/56* (2010.01)
*H01L 33/50* (2010.01)
*H01L 21/02* (2006.01)
*H01L 33/60* (2010.01)
*H01L 33/54* (2010.01)

(52) U.S. Cl.
CPC ........ *H01L 21/02282* (2013.01); *H01L 21/02* (2013.01); *H01L 21/02104* (2013.01); *H01L 33/505* (2013.01); *H01L 33/507* (2013.01); *H01L 33/56* (2013.01); *H01L 33/60* (2013.01); *H01L 33/54* (2013.01); *H01L 2933/005* (2013.01); *H01L 2933/0041* (2013.01); *H01L 2933/0058* (2013.01); *H01L 2933/0091* (2013.01)

(58) Field of Classification Search
None
See application file for complete search history.

(56) References Cited

U.S. PATENT DOCUMENTS

| 2012/0288973 | A1 | 11/2012 | Matsunaga |
| 2014/0107235 | A1* | 4/2014 | Gamlin .................. B01J 8/0415 518/706 |
| 2017/0165641 | A1* | 6/2017 | Dias ...................... C07C 51/377 |
| 2017/0284746 | A1* | 10/2017 | Miwa ..................... F28D 20/003 |

FOREIGN PATENT DOCUMENTS

WO   WO-2011-083841 A1   7/2011

* cited by examiner

*Primary Examiner* — Asok K Sarkar
(74) *Attorney, Agent, or Firm* — Foley & Lardner LLP

(57) ABSTRACT

The method includes the steps of: storing slurry containing optical matter particles into a slurry tank; stirring the slurry inside the slurry tank by causing a bubble producing unit arranged below a liquid surface of the slurry to produce bubbles; and spraying the slurry onto a coating target including a light emitting element from a nozzle arranged above the coating target.

10 Claims, 8 Drawing Sheets

(AT INITIAL STAGE OF SPRAY COATING STEP)

(AT SPRAY INJECTION OF SPRAY COATING STEP)

METHOD OF MANUFACTURING LIGHT EMITTING DEVICE

CROSS-REFERENCE TO RELATED APPLICATIONS

The present application claims priority under 35 U.S.C. § 119 to Japanese Patent Application No. 2016-254345, filed Dec. 27, 2016. The contents of this application are incorporated herein by reference in their entirety.

BACKGROUND

The disclosure relates to a method of manufacturing a light emitting device which includes a light emitting element and a resin member containing optical matter particles.

As a light emitting device which includes a light emitting element and a resin member containing optical matter particles, there is known, for example, a white diode which includes a combination of a light emitting diode (LED) emitting blue light and a fluorescent layer as a wavelength conversion matter capable of absorbing a portion of the blue light emitted by the LED and converting its wavelength to produce light with a different wavelength (for example, yellow light) and which produces white light by performing color mixing of the blue light and the yellow light.

As a method of manufacturing such a light emitting device, there is proposed a method of applying by spraying a slurry containing a resin and optical matter particles such as phosphor to a coating target including an LED (for example, see International Publication No. WO 2011/083841).

Note that it is desired to improve the coating quality of the optical matter particles, specifically to provide the coating target with a finer coating of the optical matter particles. In this respect, the coating quality of the optical matter particles often decreases if the optical matter particles contained in the slurry are sedimented or if the optical matter particles in the slurry are not dispersed. For this reason, it is necessary to prevent sedimentation of the optical matter particles and to disperse the optical matter particles in the slurry in order to improve the coating quality of the optical matter particles.

In light of the foregoing, for example, there is conventionally proposed a method of manufacturing a light emitting device which includes a spray coating step: preparing two slurry tanks to contain the slurry; circulating the slurry between the two slurry tanks; supplying the circulating slurry to a spray nozzle; and spraying the slurry onto the coating target through the spray nozzle. Such a conventional method of manufacturing a light emitting device enables stirring of the slurry by circulating the slurry between the two slurry tanks. Thus, it is possible to prevent sedimentation of the optical matter particles contained in the slurry and to uniformly disperse the optical matter particles in the slurry.

SUMMARY

However, desired is a method of manufacturing a light emitting device which is capable of improving the coating quality of the optical matter particles to an even higher level.

A method of manufacturing a light emitting device according to an embodiment of the disclosure has been made to achieve the objective described above, and a main object thereof is to provide a method of manufacturing a light emitting device which includes a spray coating step with an improved coating quality of the optical matter particles.

For the purpose of achieving the object described above, a method of manufacturing a light emitting device according to an embodiment of the disclosure includes the steps of: storing slurry containing optical matter particles into a slurry tank; stirring the slurry by causing a bubble producing unit arranged below a liquid surface of the slurry to produce bubbles inside the slurry tank; and spraying the slurry onto a coating target including a light emitting element from a nozzle arranged above the coating target.

The method of manufacturing a light emitting device according to the embodiment of the disclosure makes it possible to improve the coating quality of the optical matter particles because the method includes a step of stirring the slurry by causing a bubble producing unit arranged below the liquid surface of the slurry to produce bubbles inside the slurry tank.

DESCRIPTION OF THE EMBODIMENTS

Figure 1:
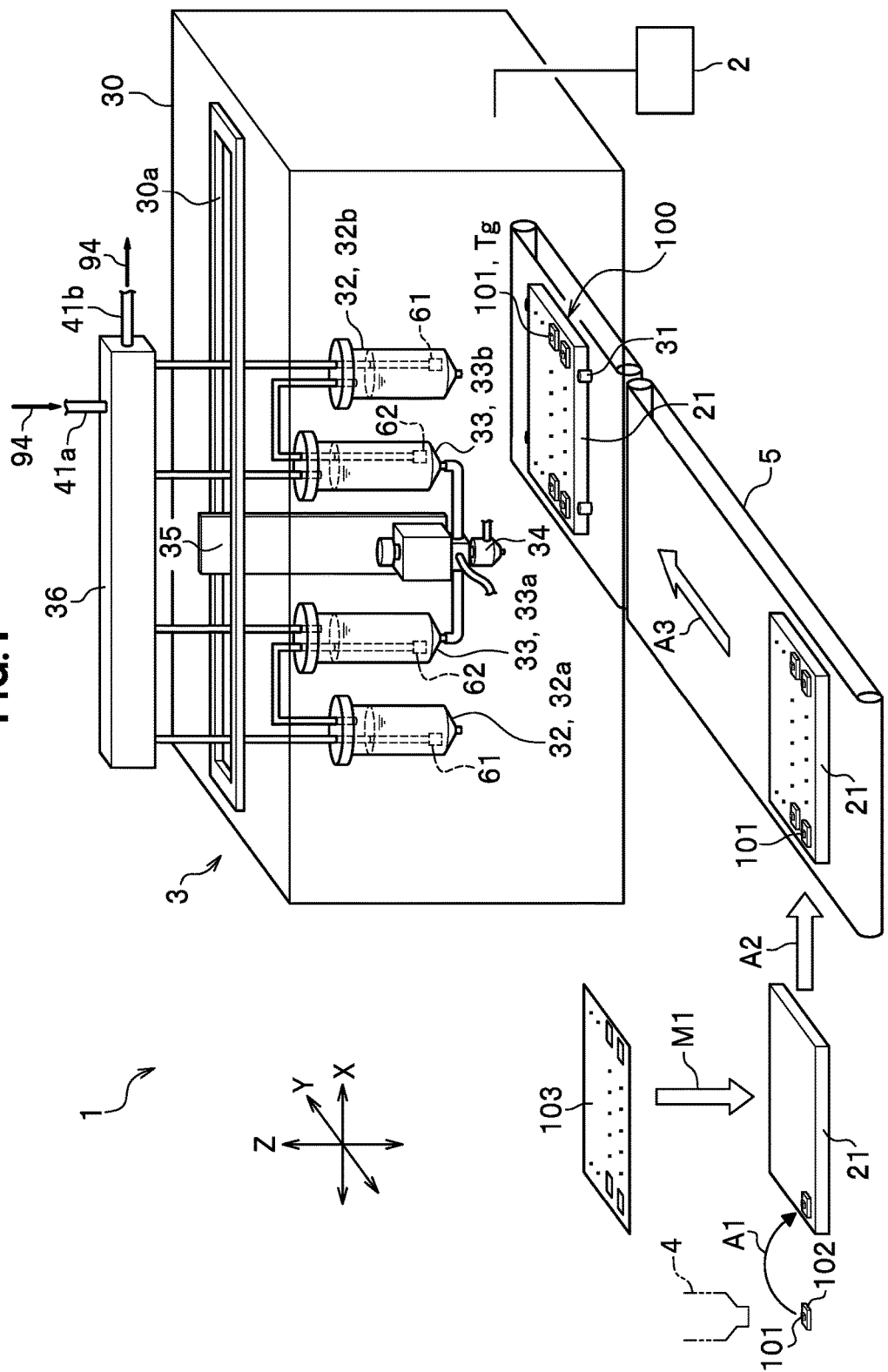
FIG. 1 is a schematic diagram showing an overall configuration of a manufacture apparatus for a light emitting device used in an embodiment.

Hereinafter, description is provided in detail for an embodiment of the disclosure (referred to as the "present embodiment" in the following description) with reference to the drawings. Note that the drawings are only illustrated schematically to an extent that enables sufficient understanding of the disclosure. Hence, the disclosure is not limited only to the illustrated examples. Also, in the drawings, the same constituents and similar constituents are given the same reference numerals and overlapping explanations thereof are omitted.

<Configuration of Manufacture Apparatus>

Figure 2:
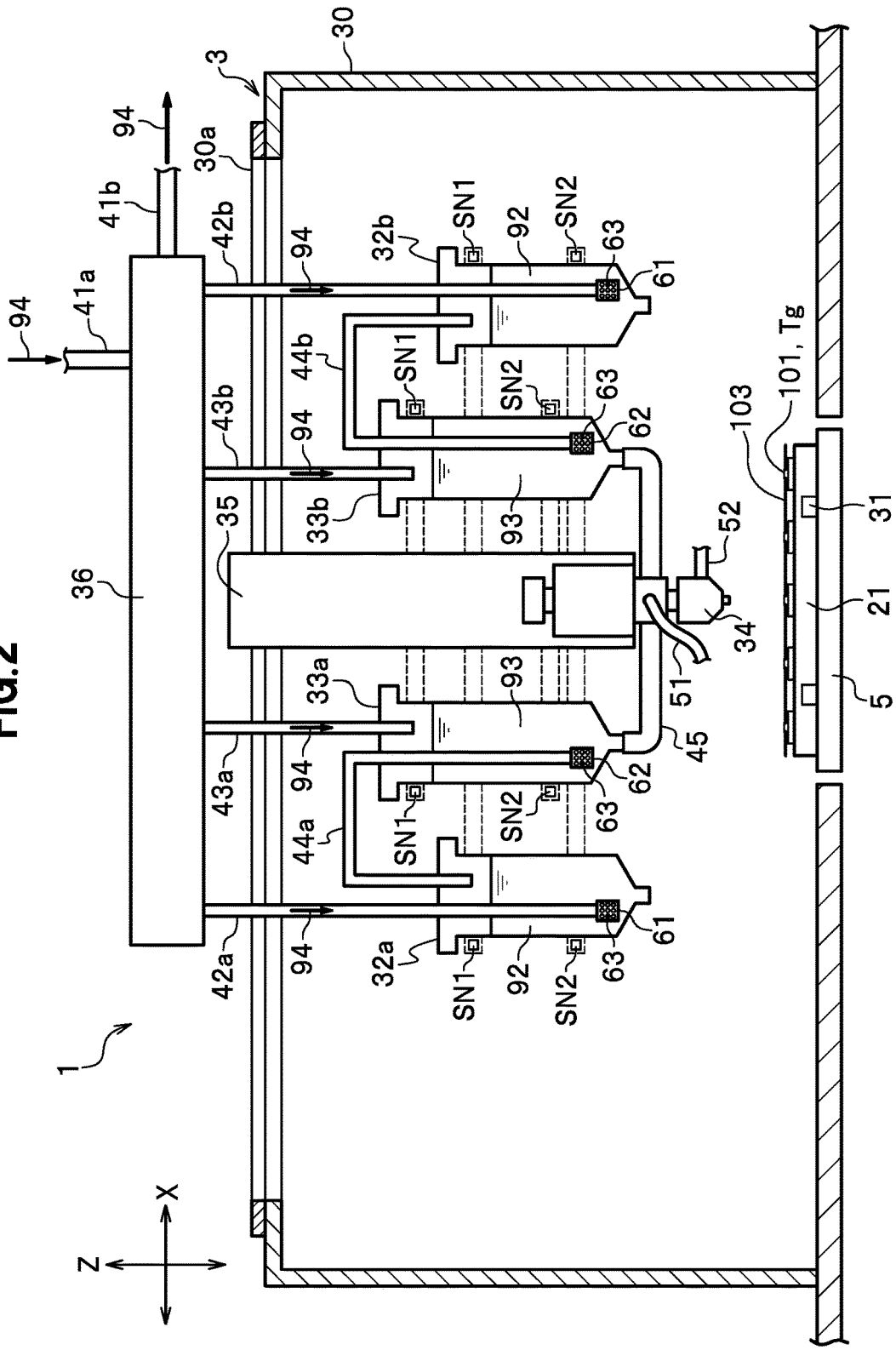
FIG. 2 is a schematic diagram partially showing a configuration of the manufacture apparatus for the light emitting device used in the embodiment.
Figure 3:
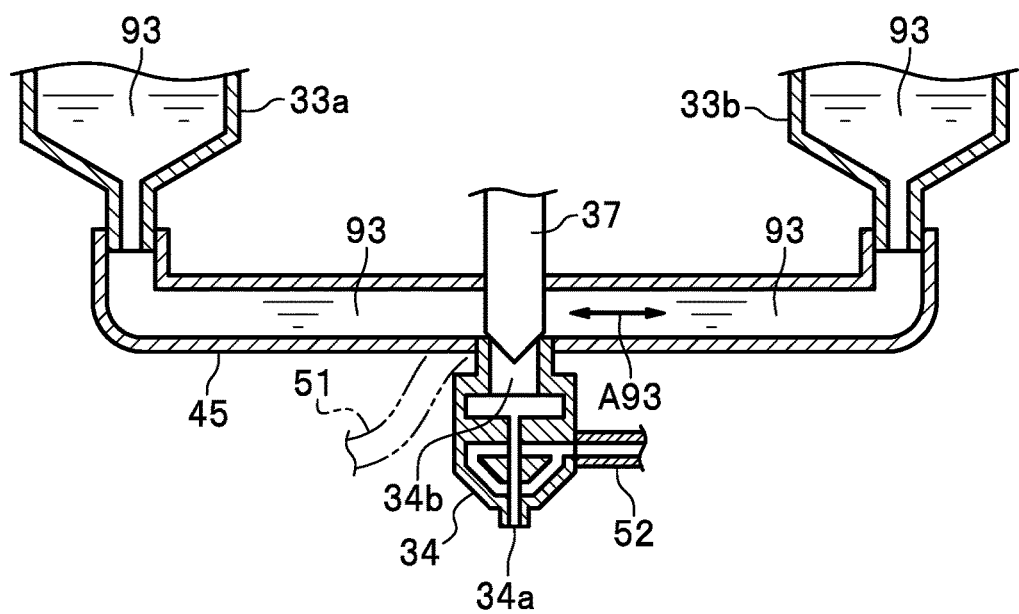
FIG. 3 is a schematic diagram showing a configuration in the vicinity of a spray nozzle of manufacture apparatus for the light emitting device used in the embodiment.

Hereinafter, with reference to FIG. 1 to FIG. 3, a description is provided for a configuration of a manufacture apparatus 1 of a light emitting device 100 used in the present embodiment. FIG. 1 is a schematic diagram illustrating an overall configuration of the manufacture apparatus 1 of the light emitting device 100 used in the present embodiment. FIG. 2 is a schematic diagram partially illustrating a configuration of the manufacture apparatus 1. FIG. 3 is a diagram illustrating a configuration in the vicinity of a spray nozzle 34 of the manufacture apparatus 1.

Here, emphasis is placed on the configuration of a coating apparatus 3 of the manufacture apparatus 1. For other configurations, only an outline is explained.

Note that in the present embodiment, an X-axis direction is described as a "right-left direction," a Y-axis direction as a "front-rear direction," and a Z-axis direction as an "up-down direction." In addition, description is provided assuming that a coating target Tg of slurry 93 (see FIG. 2) to be explained later is mounted on a substrate 102 in advance. The slurry 93 contains optical matter particles 91 to be explained later (see FIG. 8).

(Overall Configuration of Manufacture Apparatus)

As illustrated in FIG. 1, the manufacture apparatus 1 used in the present embodiment at least includes a controller 2, the coating apparatus 3, a placing unit 4, and a conveyance unit 5.

The controller 2 controls the overall operation of the manufacture apparatus 1. The controller 2 is, for example, a personal computer. The operation of the manufacture apparatus 1 is specified by a control program readably stored in advance in storage means and is executed by processing means.

Figure 8:
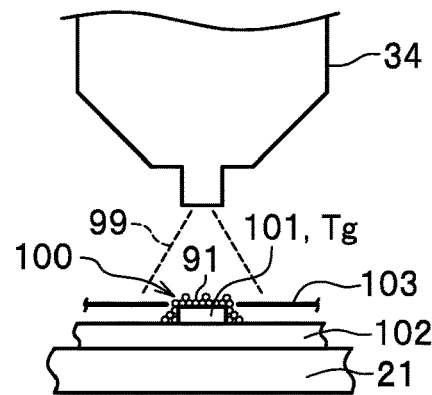
FIG. 8 is a schematic diagram (5) explaining the method of manufacturing the light emitting device according to the embodiment.

The coating apparatus 3 is an apparatus which provides the coating target Tg with a coating of the optical matter particles 91 (see FIG. 8) by causing the spray nozzle 34 to coat the coating target Tg by spray injection with the slurry 93 (see FIG. 2) as an injection liquid 99 (see FIG. 8).

The placing unit 4 is an apparatus which places the substrates 102 each mounted with the coating target Tg on a stage 21.

The conveyance unit 5 is an apparatus which conveys the stage 21 into a coating booth 30.

The coating apparatus 3 includes the coating booth 30, a stage transfer mechanism 31, two solvent tanks 32a and 32b, two slurry tanks 33a and 33b, the spray nozzle 34, a support member 35, an electromagnetic valve mechanism 36, and bubble producing units 61 and 62.

The two solvent tanks 32a and 32b have the same configuration. Also, the two slurry tanks 33a and 33b have the same configuration. Hereinafter, the two solvent tanks 32a and 32b are referred to as a "solvent tank 32" when collectively referred to. In addition, the two slurry tanks 33a and 33b are referred to as a "slurry tank 33" when collectively referred to. In the illustration, the solvent tank 32a and the slurry tank 33a are arranged on the left side of the support member 35. On the other hand, the solvent tank 32b and the slurry tank 33b are arranged on the right side of the support member 35.

The coating booth 30 is a booth provided for spray injection of the slurry 93 (see FIG. 2) onto the coating target Tg. The coating booth 30 is formed in the shape of a rectangle or a square (a square prism) in a plan view, for example.

The stage transfer mechanism 31 is a mechanism which transfers the stage 21 in the front-rear direction (Y-axis direction) at a position below the spray nozzle 34 inside the coating booth 30.

The solvent tank 32 is a syringe-shaped container which stores volatile solvent 92 (see FIG. 2) to be supplied to the slurry tank 33. The solvent tank 32 stores the same solvent 92 (see FIG. 2) as that contained in the slurry 93 (see FIG. 2) stored in the slurry tank 33.

The slurry tank 33 is a syringe-shaped container which stores the slurry 93 (see FIG. 2) to be supplied to the spray nozzle 34.

The spray nozzle 34 is an apparatus which sprays the slurry 93 (see FIG. 2) onto the coating target Tg as the injection liquid 99 (see FIG. 8). The spray nozzle 34 is provided at the middle portion of a connection tube 45 which connects the two slurry tanks 33 together.

The support member 35 is a member which supports the solvent tanks 32a and 32b, the slurry tanks 33a and 33b, and the spray nozzle 34. The support member 35 is supported so as to be movable in the up-down direction (Z-axis direction) and the right-left direction (X-axis direction) by a not-illustrated support member transfer mechanism.

The electromagnetic valve mechanism 36 is a mechanism which selectively supplies gas 94 containing air or inactive gas to at least one of the solvent tanks 32 and the slurry tanks 33.

Each of the bubble producing units 61 and 62 is a mechanism which produces bubbles in the liquid (here, the solvent 92 (see FIG. 2) or the slurry 93 (see FIG. 2)).

The slurry 93 (see FIG. 2) contains the optical matter particles 91 (see FIG. 8), a binder, and an organic solvent (hereinafter simply referred to as the "solvent"). The optical matter particles 91 are made of a fluorescent matter, a light diffusing matter, and a light reflecting matter, for example. The binder is a thermosetting resin such as a translucent silicone resin, an epoxy resin, and a urea-formaldehyde resin, for example. The solvent is volatile solvent such as n-hexane, n-heptane, toluene, and acetone, for example. The mixing ratio of the optical matter particles 91, the binder, and the solvent can be determined appropriately depending on the intended use. It is possible to use the slurry 93 in the present embodiment with a viscosity of, for example, about 0.3 mPa·s to 1000 mPa·s, and effectively with a viscosity of about 100 mPa·s. Additionally, it is effective to use the optical matter particles 91 in the present embodiment with a median particle diameter of about 15±5 for example. The viscosity of the slurry 93 can be determined as appropriate by adjusting the amounts and the types of the materials constituting the slurry 93.

The manufacture apparatus 1 manufactures the light emitting device 100 by providing the coating target Tg with a coating of the optical matter particles 91 and then providing post-treatment to the coating target Tg such as heating.

In this embodiment, description is provided assuming that the coating target Tg is an LED chip 101 being a light emitting element. Additionally, description is provided assuming that the optical matter particles 91 (see FIG. 8) are made of fluorescent matter. The fluorescent matter is a wavelength conversion matter which absorbs a portion of light emitted by the LED chip 101 and converts its wavelength to produce light with a different wavelength. Moreover, description is provided assuming that the LED chip 101 emits blue light and that the optical matter particles 91 absorb a portion of the blue light and convert its wavelength to produce yellow light. Furthermore, description is provided assuming that the light emitting device 100 produces white light by performing color mixing of blue light emitted by the LED chip 101 and yellow light subjected to wavelength conversion by the optical matter particles 91, and emits the produced white light to the outside.

Note that the light emitting device 100 is not limited to the combination of blue light and yellow light. If the optical matter particles 91 are made of fluorescent matter, the light emitting device 100 is capable of outputting at least a portion of the light emitted by the LED chip 101, the wavelength of which is converted by the optical matter particles 91. For example, the light emitting device 100 may be configured such that the LED chip 101 emits blue light and the optical matter particles 91 convert the blue light to red light and/or green light, or such that the LED chip 101 emits ultraviolet light and the optical matter particles 91 convert the ultraviolet light to light with a longer wavelength, e.g. blue light, green light, yellow light, or red light.

Further, the coating target Tg may be one used as a member of the light emitting device 100. Other than the LED chip 101, the coating target Tg may be the substrate 102 on which the light emitting element 101 is placed or may be made of translucent resin.

Materials publicly known in the art can be used as the fluorescent matter. For example, the fluorescent matter includes: a YAG (yttrium aluminum garnet) based fluorescent matter activated by Ce (cerium); a LAG (lutetium aluminum garnet) based fluorescent matter activated by Ce; a nitrogen-containing calcium aluminosilicate ($CaO$—$Al_2O_3$—$SiO_2$) based fluorescent matter activated by Eu (europium) and/or Cr (chromium); a silicate (($Sr,Ba)_2SiO_4$) based fluorescent matter activated by Eu; a β-sialon fluorescent matter; and a KSF ($K_2SiF_6$: Mn) based fluorescent matter.

It is preferable to add a binding material for binding the fluorescent matters together to the aforementioned slurry 93. For example, the binding material used may be an inorganic translucent material such as $SiO_2$, $Al_2O_3$, MSiO (M stands for Zn, Ca, Mg, Ba, Sr, Zr, Y, etc.).

What is more, a translucent inorganic particulate matter may be added in order to adjust the viscosity of the slurry 93 at spray injection or to provide a light diffusing property to the layer of the optical matter particles 91 formed in the light emitting device 100. For example, as a translucent inorganic particulate matter (inorganic filler), it is possible to use an oxide, a carbonate, a sulfate, or a nitride of a rare earth element such as Si, Al, Zn, Ca, Mg, or Y, or of an element such as Zr or Ti, or to use e.g. a composite salt such as bentonite or potassium titanate.

(Configuration of Manufacture Apparatus)

As illustrated in FIG. 2, the electromagnetic valve mechanism 36 is arranged outside the coating booth 30. Besides, arranged inside the coating booth 30 are the solvent tanks 32a and 32b, the slurry tanks 33a and 33b, the spray nozzle 34, etc.

The electromagnetic valve mechanism 36 is connected to a suction tube 41a, an exhaust tube 41b, and connection tubes 42a, 42b, 43a, and 43b. The suction tube 41a is a tube which takes in the gas 94 into the electromagnetic valve mechanism 36. The exhaust tube 41b is a tube which exhausts the gas 94 to the outside of the electromagnetic valve mechanism 36. The connection tubes 42a and 42b are tubes which supply the gas 94 from the electromagnetic valve mechanism 36 to the solvent tanks 32a and 32b, respectively. In addition, the connection tubes 43a and 43b are tubes which supply the gas 94 from the electromagnetic valve mechanism 36 to the slurry tanks 33a and 33b, respectively.

A lower end portion of the connection tube 42a is inserted into the solvent tank 32a. A lower end portion of the connection tube 42b is inserted into the solvent tank 32b. A lower end portion of the connection tube 43a is inserted into the slurry tank 33a. A lower end portion of the connection tube 43b is inserted into the slurry tank 33b.

Out of the two solvent tanks 32a and 32b, the solvent tank 32a arranged on the left side is connected via the connection tube 42a to the electromagnetic valve mechanism 36 and is connected via the connection tube 44a to the slurry tank 33a. On the other hand, the solvent tank 32b arranged on the right side is connected via the connection tube 42b to the electromagnetic valve mechanism 36 and is connected via the connection tube 44b to the slurry tank 33b.

Out of the two slurry tanks 33a and 33b, the slurry tank 33a arranged on the left side is connected via the connection tube 43a to the electromagnetic valve mechanism 36, is connected via the connection tube 44a to the solvent tank 32a, and is connected via the connection tube 45 to the spray nozzle 34 and to the slurry tank 33b arranged on the right side. On the other hand, the slurry tank 33b arranged on the right side is connected via the connection tube 43b to the electromagnetic valve mechanism 36, is connected via the connection tube 44b to the solvent tank 32b, and is connected via the connection tube 45 to the spray nozzle 34 and to the slurry tank 33a arranged on the left side.

An opening portion 30a is formed in a top plate of the coating booth 30. The support member 35, the connection tubes 42a, 42b, 43a, and 43b, etc. are arranged across the inside and the outside of the coating booth 30 via the opening portion 30a. For example, the opening portion 30a is hermetically sealed by a not-illustrated filter such as a HEPA filter.

Liquid surface sensors SN1 and SN2 are arranged around each of the solvent tanks 32 and the slurry tanks 33. Each of the liquid surface sensors SN1 and SN2 is a sensor which detects the liquid surface of the liquid (here, the solvent 92 or the slurry 93) stored in the solvent tank 32 or the slurry tank 33. Description is herein provided assuming that the liquid surface sensor SN1 is arranged at a position higher than the liquid surface sensor SN2.

The bubble producing unit 61 is arranged in each of the solvent tanks 32a and 32b. Also, the bubble producing unit 62 is arranged in each of the slurry tanks 33a and 33b. The bubble producing units 61 and 62 have the same configuration.

The bubble producing units 61 and 62 each are a porous member made of, for example, resin material or metal material. Each of the bubble producing units 61 and 62 is formed in the shape of a half-open cylinder (i.e. a shape with one end of the cylinder open and the other end of the cylinder closed).

Each of the bubble producing units 61 and 62 is attached to the lower end portion of the corresponding one of the connection tubes 42a, 42b, 44a, and 44b. An inner diameter of each of the bubble producing units 61 and 62 is a value almost the same as (slightly larger than) an outer diameter of the lower end portion of the corresponding one of the connection tubes 42a, 42b, 44a, and 44b.

Each of the bubble producing units 61 and 62 is arranged at a position below the corresponding liquid surface sensor SN2. The manufacture apparatus 1 produces bubbles in the liquid by supplying the gas 94 from the electromagnetic valve mechanism 36 to the solvent tank 32 or to the slurry tank 33 if the liquid surface of the liquid (here, the solvent 92 or the slurry 93) stored in the solvent tank 32 or the slurry tank 33 is above the liquid surface sensor SN2.

Each of the bubble producing units 61 and 62 has vent holes 63 formed therein which penetrate from the inside to the outside. The size of each vent hole 63 is set to a value appropriate for bubbles to be produced. Description is provided herein assuming that the shape of each vent hole 63 is, for example, circular, and that the diameter of the vent hole 63 is set to a value of about 0.3 μm. Note that the shape of the vent hole 63 can be a shape other than a circle, e.g. an ellipse, a rectangle, or a polygon. Furthermore, the shape of the vent hole 63 may be a shape formed by combining more than one shape or may be non-uniform (different from one another). The number of vent holes 63 may be one or more and may be set to a value appropriate for bubbles to be produced. The shape of the vent hole 63 may preferably be a shape of a uniform size that enables production of numerous bubbles. For example, it is possible to well produce numerous bubbles of a uniform size if a porous material such as a porous ceramic or a porous resin is used for the bubble producing units 61 and 62 and the pores formed in such a material are utilized as a group of vent holes, the vent holes 63.

(Configuration in Vicinity of Spray Nozzle of Manufacture Apparatus)

As illustrated in FIG. 3, the spray nozzle 34 of the present embodiment is arranged at the middle portion of the connection tube 45 which connects the two slurry tanks 33a and 33b. The slurry 93 is circulating inside the connection tube 45 (see arrow A93).

The spray nozzle 34 includes an injection hole 34a, a flow path 34b, a needle 37, and suction tubes 51 and 52.

The injection hole 34a is a part which injects the slurry 93 to the outside.

The flow path 34b is a path for guiding the slurry 93 to the injection hole 34a. The flow path 34b is a branch connected to the middle portion of the connection tube 45.

The needle 37 is a member which selectively switches the flow path 34b to an open state (a state to allow the inflow of the slurry 93) or to a closed state (a state not to allow the inflow of the slurry 93) by moving up and down. The needle 37 is constantly biased downward by not-illustrated biasing means. For this reason, the needle 37 is kept down in the case of not spraying the slurry 93. Thus, the flow path 34b is in the closed state.

The suction tubes 51 and 52 are tubes which take in gases 95 and 96 such as compressed air (see FIG. 7) into the inside of the spray nozzle 34, respectively. The gas 95 is used in the case of switching the flow path 34b to the open state by moving up the needle 37. The gas 96 is used in the case of injecting the slurry 93 as the injection liquid 99 (see FIG. 7).

<Method of Manufacturing Light Emitting Device>

The method of manufacturing the light emitting device 100 according to the present embodiment includes the steps of: (1) storing the slurry 93 containing the optical matter particles 91 into the slurry tank 33 (the solvent•slurry storing step at S105 of FIG. 4); (2) stirring the slurry 93 by causing the bubble producing unit 62 arranged below the liquid surface of the slurry 93 to produce bubbles 98 inside the slurry tank 33; and spraying the slurry 93 onto the coating target Tg including the light emitting element from the nozzle 34 arranged above the coating target Tg (the spray coating step at S120 of FIG. 4). Note that at the spray coating step of S120, the step of stirring the slurry 93 and the step of spraying the slurry 93 are performed almost at the same time.

Hereinafter, with reference to FIG. 4 to FIG. 10, description is provided for the method of manufacturing the light emitting device 100 according to the present embodiment.

Figure 4:
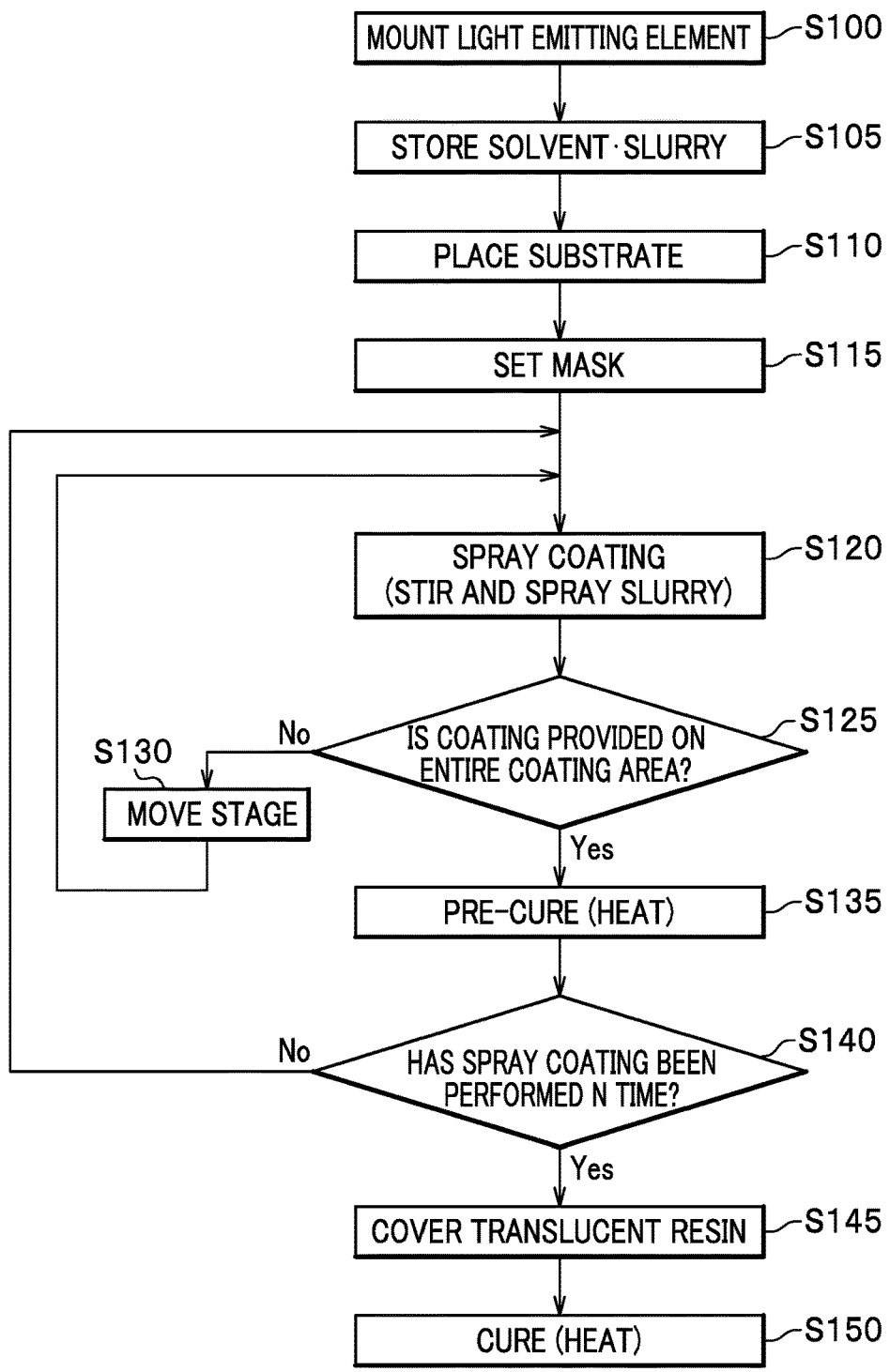
FIG. 4 is a flowchart showing a method of manufacturing the light emitting device according to the embodiment.

FIG. 4 is a flowchart illustrating the method of manufacturing the light emitting device 100 according to the present embodiment. Each of FIG. 5A to FIG. 10 is a schematic diagram explaining the method of manufacturing the light emitting device 100 according to the present embodiment.

The method of manufacturing the light emitting device 100 according to the present embodiment includes, at the spray coating step to be described later (S120 of FIG. 4): stirring the slurry 93 by causing the bubble producing unit 62 arranged inside the slurry tank 33 to produce the bubbles 98 in the slurry 93 stored in the slurry tank 33; supplying the slurry 93 to the spray nozzle 34 connected to the slurry tanks 33; and spraying the slurry 93. The bubbles 98 are gas containing one or both of air and inactive gas.

It is preferable that the gas used as the inactive gas do not react with or do not easily react with the materials in the slurry 93, i.e. the solvent, the optical matter, the binder, etc. Also, it is preferable that the gas used as the inactive gas be safe if it is released to the outside of the coating apparatus 3. Examples of such a gas include nitrogen and argon.

In addition, the method of manufacturing the light emitting device 100 according to the present embodiment also includes, at the spray coating step to be described later (S120 of FIG. 4), stirring the solvent 92 by causing the bubble producing unit 61 arranged inside the solvent tank 32 to produce bubbles 97 in the solvent 92 stored in the solvent tank 32. The bubbles 97 in the solvent 92 are gas containing one or both of air and inactive gas, as in the case of the bubbles 98 in the slurry 93.

It is possible to stir the slurry 93, to prevent sedimentation of the optical matter particles 91 contained in the slurry 93, and to uniformly disperse the optical matter particles 91 in the slurry 93 by producing the bubbles 98 in the slurry 93. On the other hand, it is possible to promote vaporization of the solvent 92, to allow the gas 94 inside the solvent tank 32 to contain the vapor of the solvent 92, and to supply the gas 94 containing the vapor of the solvent 92 from the solvent tank 32 to the slurry tanks 33 by producing the bubbles 97 in the solvent 92.

After the gas 94 containing the vapor of the solvent 92 is supplied from the solvent tank 32 to the slurry tank 33, the vapor of the solvent 92 stays in the upper space inside the slurry tank 33. Thus, it is possible to suppress the vaporization of the solvent which is contained in the slurry 93 stored in the slurry tank 33. To be more specific, the spray injectability might be affected by the change in the viscosity of the slurry 93 or in the concentration of the optical matter particles 91 in the slurry 93 when the solvent contained in the slurry 93 vaporizes. For this reason, there is a case where the vaporization of the solvent contained in the slurry 93 is not preferable. In light of the above, the coating apparatus 3 in the present embodiment suppresses the vaporization of the solvent which is contained in the slurry 93 stored in the slurry tanks 33 by supplying the gas 94 containing the vapor of the solvent 92 form the solvent tank 32 to the slurry tank 33 and then allowing the vapor of the solvent 92 to stay in the upper space inside the slurry tank 33.

The volume and size of the bubbles produced differ depending on the liquid pressure and the viscosity of the slurry, but may be any values as long as the object described above can be achieved. For example, the volume of the bubbles produced is preferably about 0.1 to 100 times and more preferably about 1 to 10 times the tank internal volume or the volume of the slurry in the tank. For example, the size of the bubbles is preferably about 1 to 2000 μm and more preferably about 10 to 500 μm from the viewpoint of stabilizing the coating amount of slurry. Incidentally, the density in the slurry 93 can be set as appropriate.

As illustrated in FIG. 4, the method of manufacturing the light emitting device 100 according to the present embodiment includes: a light emitting element mounting step (S100); a solvent•slurry storing step (S105); a substrate placing step (S110); a mask setting step (S115); a spray coating step (S120); a step of determining whether the coating is provided on the entire coating area (S125); a stage moving step (S130); a pre-curing (heating) step (S135); a step of determining whether the spray coating has been performed N times (S140); a translucent resin covering step (S145); and a curing (heating) step (S150).

Note that the series of steps illustrated in FIG. 4 is only an example, and the order and the content of the steps can be changed appropriately. It is possible to perform more than one step at the same time. It is also possible to omit one or more of the steps.

In the method of manufacturing the light emitting device 100 according to the present embodiment, the light emitting element mounting step is performed where the light emitting element is mounted on the substrate 102 (S100). The mounting can be performed by placing a singulated LED chip 101 on the substrate 102 with an adhesive applied on the surface thereof, for example. In the present embodiment, the LED chip 101 is the coating target Tg at the spray coating step (S120) to be described later.

At the light emitting element mounting step S100, wire bonding may be performed depending on the configuration of the LED chip 101 where the electrodes of the LED chip 101 and the wiring electrodes of the substrate 102 are electrically connected by wire.

After the light emitting element mounting step S100, the solvent•slurry storing step is performed where the solvent 92 is stored in the solvent tank 32 and the slurry 93 is stored in the slurry tank 33 (S105). Any apparatus may perform the storing.

After the solvent•slurry storing step S105, the substrate placing step is performed where the substrates 102 are placed on the stage 21 (S110). The placing of the substrates 102 can be performed such that, as indicated with arrow A1 in FIG. 1, the placing unit 4 picks up the substrate 102 disposed at a certain location and places the substrate 102 on the stage 21, for example.

After the substrate placing step S110, the mask setting step is performed where a mask 103 is set on the substrate 102 (S115). The setting of the mask 103 can be performed such that, as indicated with arrow M1 in FIG. 1, the placing unit 4 picks up the mask 103 formed in the shape of a sheet disposed at a certain location and places the mask 103 on a support portion provided on the stage 21, for example. Alternatively, the setting of the mask 103 can also be performed by forming a layer of e.g. resist material on the surface of the LED chip 101. The mask 103 has openings formed therein corresponding to the shape of the area of the LED chip 101 to be coated with the slurry 93 (hereinafter referred to as the "coating area").

After that, the stage 21 is installed inside the coating booth 30. Here, it is preferable to install the stage 21 such that the upper surface of the LED chip 101 is substantially horizontal. The installation of the stage 21 can be performed such that, as indicated with arrows A2 and A3 in FIG. 1, the conveyance unit 5 receives the stage 21 from the placing unit 4, conveys the received stage 21 into the coating booth 30, and passes the stage 21 to the stage transfer mechanism 31, for example. Note that the installation of the stage 21 may be performed by an operator directly installing the stage 21 in the stage transfer mechanism 31 by hand.

After the stage 21 is installed inside the coating booth 30, the spray coating step is performed where the spray nozzle 34 coats the coating target Tg by spray injection of the slurry 93 (see FIG. 2) (S120). In the present embodiment, the coating apparatus 3 stacks several layers of the slurry 93 by spray injection over several times with a small amount at one spray injection. This makes it possible for the coating apparatus 3 to provide the coating target Tg with a thick coating of the slurry 93 and to accurately manage the thicknesses of the layers of the slurry 93. The coating target Tg is provided with a coating of the optical matter particles 91 (see FIG. 8) by spray injection of the slurry 93.

At the spray coating step S120, the coating apparatus 3 operates as follows, for example.

Figure 5A:
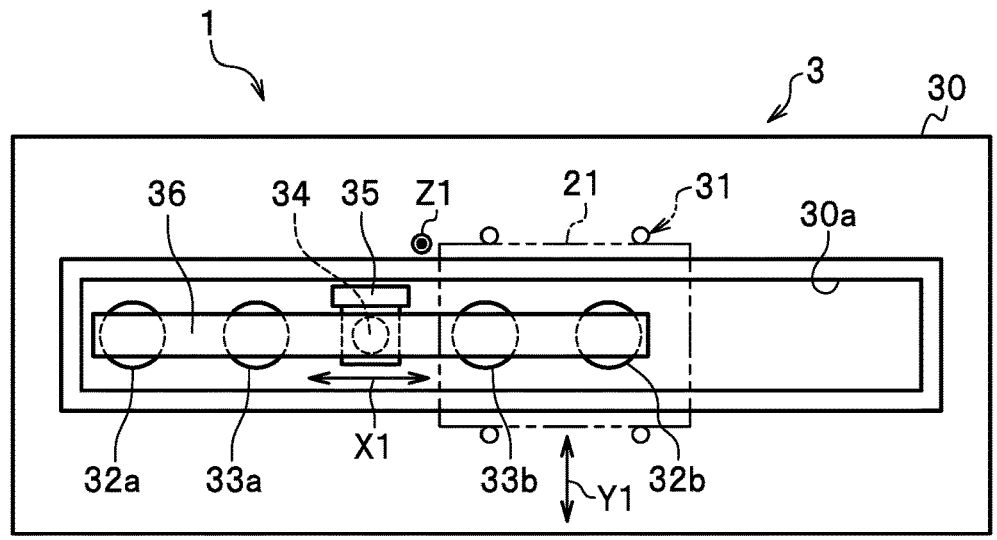
FIG. 5A is a schematic diagram (1) explaining the method of manufacturing the light emitting device according to the embodiment, and shows operations of parts of a spray nozzle at an initial stage of a spray coating step.

First, at the initial stage of the spray coating step S120, the coating apparatus 3 causes a not-illustrated support member transfer mechanism to move the support member 35 in the right-left direction (direction of arrow X1) and arranges the support member 35 at a home position, as illustrated in FIG. 5A. Here, description is provided assuming that the home position is a position where the spray nozzle 34 is moved to the leftmost side. Also here, the coating apparatus 3 arranges the spray nozzle 34 at a position with a certain height away from the upper surface of the stage 21 by a predetermined distance or more.

Next, the coating apparatus 3 causes the stage transfer mechanism 31 to move the stage 21 in the front-rear direction (direction of arrow Y1) and arranges the stage 21 at a certain position. Here, the coating apparatus 3 arranges the stage 21 such that the left edge portion of the stage 21 is located on the right side of the spray nozzle 34. Note that the operation of moving the stage 21 may be performed at the same time as or prior to the operation of moving the support member 35.

Next, the coating apparatus 3 causes the not-illustrated support member transfer mechanism to move the support member 35 in the down direction (direction of arrow Z1) (to be more specific, move the support member 35 downward) and arranges the spray nozzle 34 at a position with a certain height.

After that, the coating apparatus 3 causes the spray nozzle 34 to perform spray injection.

Figure 5B:
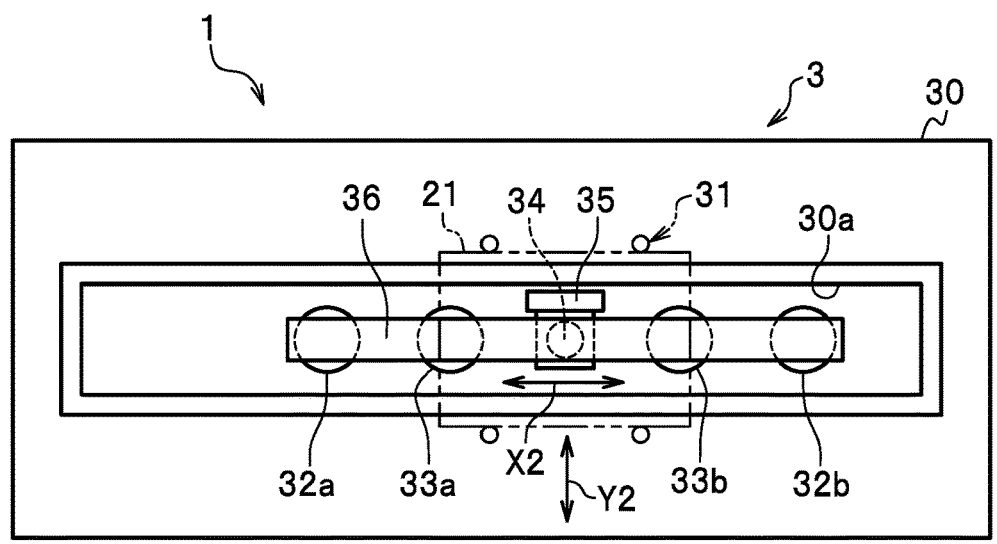
FIG. 5B is a schematic diagram (2) explaining the method of manufacturing the light emitting device according to the embodiment, and shows the operations of the parts at spray injection of the spray coating step.

At spray injection of the spray coating step S120, the coating apparatus 3 of the present embodiment causes the not-illustrated support member transfer mechanism to move the spray nozzle 34 together with the support member 35 in the right-left direction (direction of arrow X2) with the stage 21 stopped, and causes the spray nozzle 34 to spray the slurry 93 as the injection liquid 99 (see FIG. 8) onto the coating target Tg, as illustrated in FIG. 5B. Thus, the coating apparatus 3 can provide the coating target Tg with a coating of the optical matter particles 91 (see FIG. 8).

Note that in the present embodiment, a non-coating area on the surface of the coating target Tg is covered with the mask 103. For this reason, the non-coating area is not coated with the injection liquid 99 even when the coating apparatus 3 successively performs spray injection.

At the spray coating step S120, the electromagnetic valve mechanism 36 operates as illustrated in FIG. 2, for example. To be more specific, as illustrated in FIG. 2, the electromagnetic valve mechanism 36 takes in the gas 94 into the inside thereof, the gas 94 being fed from the outside via the suction tube 41a. Moreover, based on the control by the controller 2, the electromagnetic valve mechanism 36 selectively supplies the gas 94 to any of the solvent tanks 32a and 32b and the slurry tanks 33a and 33b via the connection tubes 42a, 42b, 43a, and 43b. Furthermore, the electromagnetic valve mechanism 36 exhausts excess gas 94 to the outside via the exhaust tube 41b.

Figure 6:
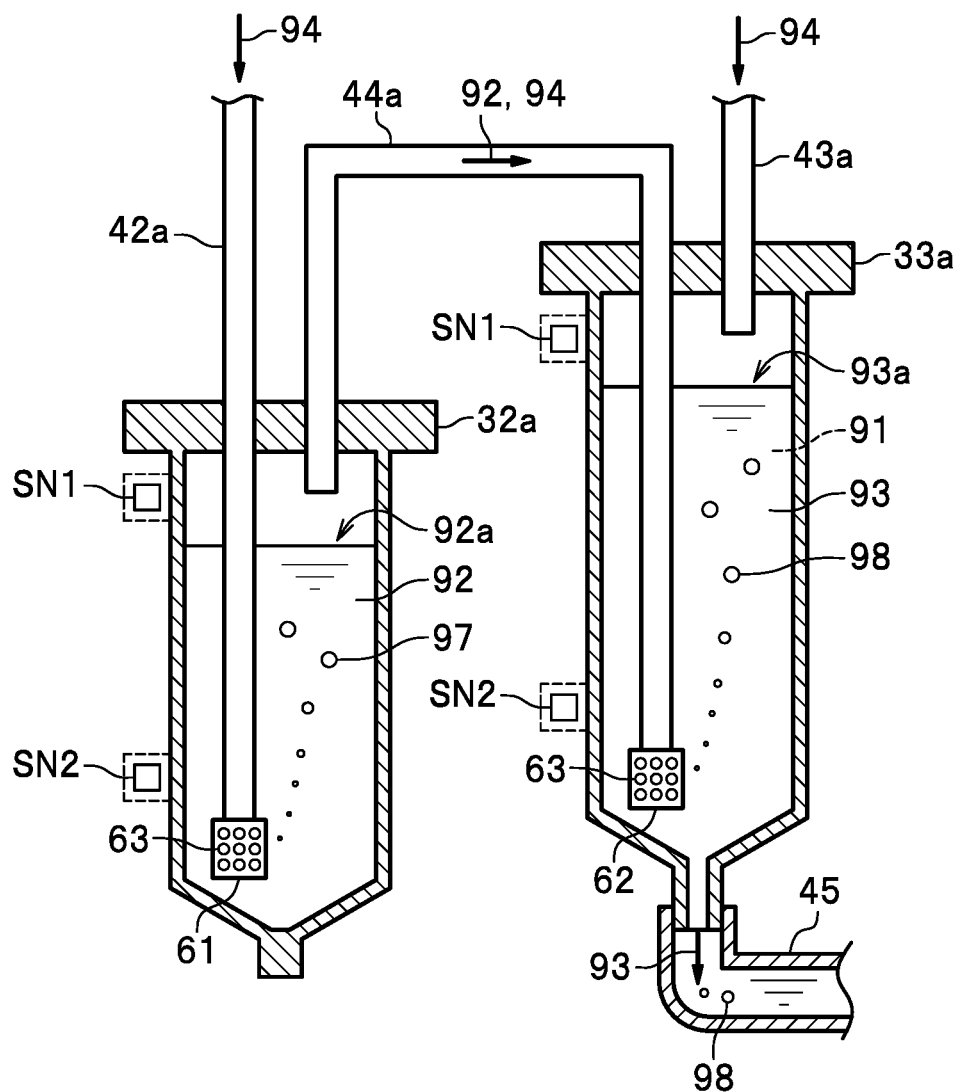
FIG. 6 is a schematic diagram (3) explaining the method of manufacturing the light emitting device according to the embodiment.

At spray coating step S120, the bubble producing units 61 and 62 operate as illustrated in FIG. 6, for example. Here, description is provided taking as an example the bubble producing unit 61 which is arranged inside the solvent tank 32a arranged on the left side and the bubble producing unit 62 which is arranged inside the slurry tank 33a arranged on the right side. Note that the operation is the same for the bubble producing unit 61 which is arranged inside the solvent tank 32b arranged on the right side and the bubble producing unit 62 which is arranged inside the slurry tank 33b arranged on the left side.

As illustrated in FIG. 2 and FIG. 6, the electromagnetic valve mechanism 36 supplies the gas 94 into the solvent tank 32a via the connection tube 42a. Here, the bubble producing unit 61 arranged inside the solvent tank 32a releases the gas 94 into the solvent 92 via the vent holes 63. Thus, the bubble producing unit 61 produces the bubbles 97 in the solvent 92.

Note that the bubble producing unit 61 is arranged below the liquid surface 92a of the solvent 92 stored in the solvent tank 32a in order to produce the bubbles 97. The liquid surface sensors SN1 and SN2 monitor the level of the liquid surface 92a of the solvent 92 and are configured such that they suspend processing and notify the operator by not-illustrated notification means to urge the operator to replenish the solvent 92 when the liquid surface 92a becomes lower than the liquid surface sensor SN2. Then, the coating apparatus 3 resumes the processing when the solvent 92 is replenished and the liquid surface 92a becomes higher than the liquid surface sensor SN2.

The bubbles 97 produced in the solvent 92 can promote the vaporization of the solvent 92. On the other hand, the gas 94 released into the solvent 92 stays in the upper space above the liquid surface 92a inside the solvent tank 32. For this reason, the vapor of the solvent 92 and the gas 94 stay in the upper space above the liquid surface 92a inside the solvent tank 32. As a result, the gas 94 inside the solvent tank 32 contains the vapor of the solvent 92.

The internal pressure of the solvent tank 32a is higher than the internal pressure of slurry tank 33a. For this reason, the gas 94 containing the vapor of the solvent 92 flows into the slurry tank 33a from the solvent tank 32a via the connection tube 44a. Here, the bubble producing unit 62 arranged inside the slurry tank 33a releases the gas 94 containing the vapor of the solvent 92 into the slurry 93 via the vent holes 63. Thus, bubble producing unit 62 produces the bubbles 98 in the slurry 93. The vapor of the solvent 92 contained in the bubbles 98 partly dissolves into the slurry 93.

Note that the bubble producing unit 62 is arranged below the liquid surface 93a of the slurry 93 stored in the slurry tank 33a in order to produce the bubbles 98. The liquid surface sensors SN1 and SN2 monitor the level of the liquid surface 93a of the slurry 93 and are configured such that they suspend processing and notify the operator by not-illustrated notification means to urge the operator to replenish the slurry 93 when the liquid surface 93a becomes lower than the liquid surface sensor SN2. Then, the coating apparatus 3 resumes the processing when the slurry 93 is replenished and the liquid surface 93a becomes higher than the liquid surface sensor SN2.

The slurry 93 is stirred by the bubbles 98 produced in the slurry 93. This makes it possible for the coating apparatus 3 to prevent sedimentation of the optical matter particles 91 contained in the slurry 93 inside the slurry tank 33a and to uniformly disperse the optical matter particles 91 in the slurry 93.

After that, when the electromagnetic valve mechanism 36 supplies the gas 94 into the slurry tank 33a via the connection tube 43a, the slurry 93 stored in the slurry tank 33a flows into the connection tube 45 from the slurry tank 33a.

Figure 7:
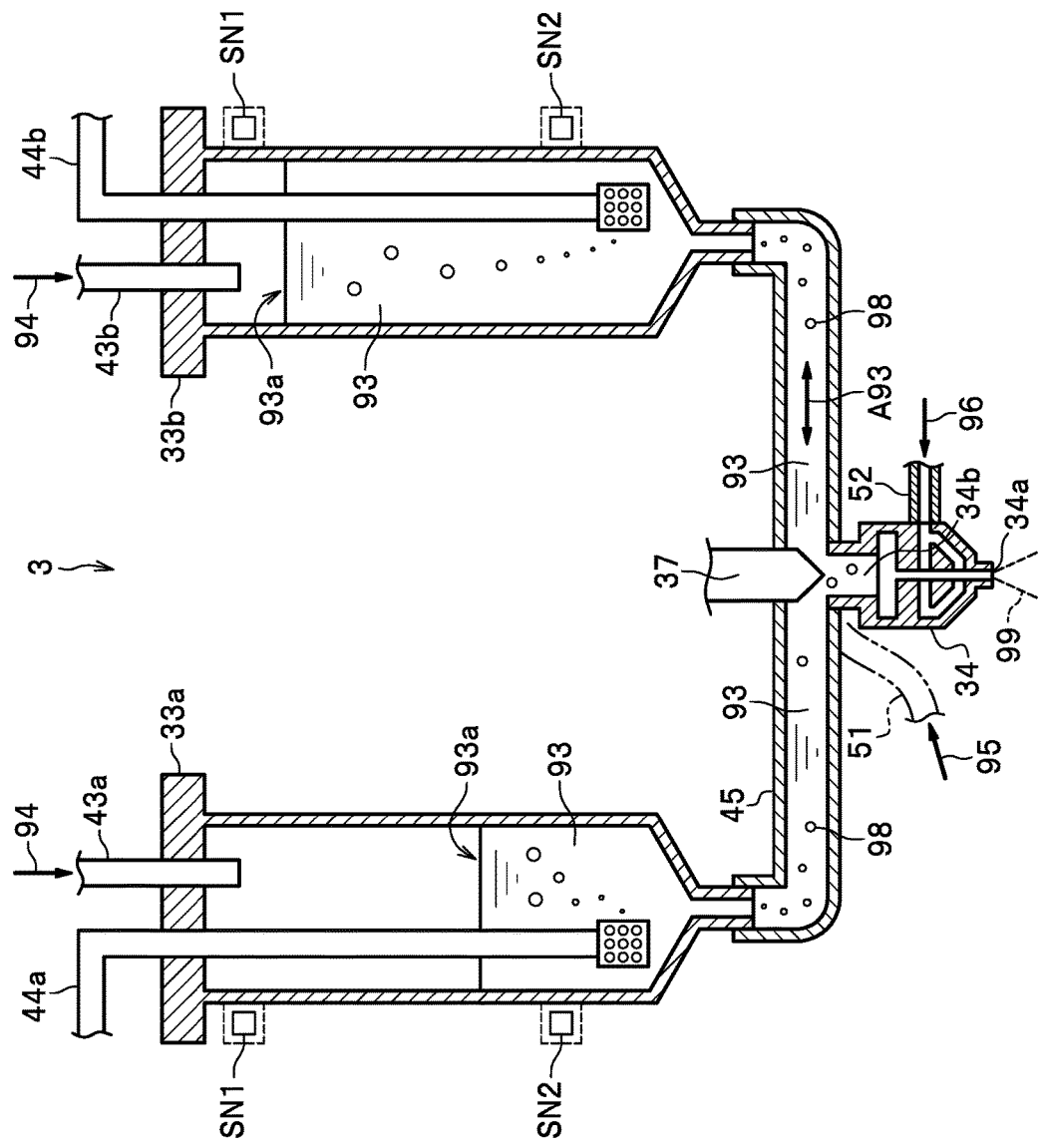
FIG. 7 is a schematic diagram (4) explaining the method of manufacturing the light emitting device according to the embodiment.

Here, as illustrated in FIG. 7, the coating apparatus 3 preferably circulates the slurry 93 inside the connection tube 45, for example (see arrow A93). It is possible to circulate the slurry 93 by the electromagnetic valve mechanism 36 supplying the gas 94 to one of the two slurry tanks 33a and 33b and pressurizing the slurry 93 stored in the tank supplied with the gas 94. Here, the slurry 93 flows from one tank (tank pressurized) to the other tank (tank not pressurized). This makes it possible for the coating apparatus 3 to constantly stir the slurry 93 inside the connection tube 45. As a result, the coating apparatus 3 can prevent sedimentation of the optical matter particles 91 contained in the slurry 93 inside the connection tube 45 and uniformly disperse the optical matter particles 91 in the slurry 93.

If the circulation of the slurry 93 inside the connection tube 45 might be insufficient as the stirring of the slurry 93, for example if more than one type of optical matter particles 91 with different specific gravities is mixed, it is preferable to also stir the slurry 93 immediately before spray injection using the bubble producing unit 62 arranged inside the slurry tank 33, as in the case of the present embodiment.

Note that even when the total amount of the slurry 93 stored in the two slurry tanks 33a and 33b is reduced by consumption of the slurry 93, the coating apparatus 3 needs to prevent such a situation that as a result of moving the slurry 93 to one tank so that the liquid surface 93a of the slurry 93 in the one tank reaches the position of the liquid surface sensor SN1, the liquid surface 93a of the slurry 93 in the other tank becomes at a position lower than the position of the liquid surface sensor SN2. To this end, the coating apparatus 3 of the present embodiment circulates the slurry 93 between the two slurry tanks 33a and 33b while causing the liquid surface sensors SN1 and SN2 arranged in both of the two slurry tanks 33a and 33b to monitor the upper limit levels and the lower limit levels of the respective liquid surfaces 93a of the slurry 93.

At the spray coating step S120, the spray nozzle 34 being a two-fluid nozzle operates as illustrated in FIG. 7, for example. To be more specific, the coating apparatus 3 feeds the gas 95 such as compressed air into the spray nozzle 34 via a suction tube 51. Here, the needle 37 is pressed upward by the gas 95 fed from the outside and is switched to the up state. Thus, the flow path 34b is in the open state. When the flow path 34b is in the open state, the slurry 93 flows into the flow path 34b from the connection tube 45.

Additionally, the coating apparatus 3 of the present embodiment feeds the gas 96 such as compressed air into the spray nozzle 34 via a suction tube 52. The spray nozzle 34 mixes the slurry 93 and the gas 96, and sprays the obtained liquid mixture as the injection liquid 99 from the injection hole 34a.

At this moment, it is possible to reduce the risk of backflow of the slurry if the pressure of the gas 96 such as compressed air is set substantially the same as or higher than the pressure of the gas being circulated between the syringes.

FIG. 8 illustrates an example of the case where the LED chip 101 arranged on the substrate 102 is the coating target Tg and the injection liquid 99 is sprayed onto the LED chip 101.

Figure 9:
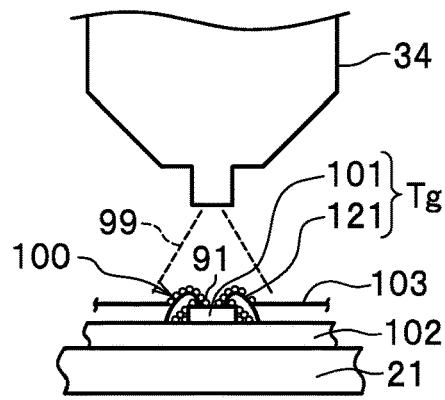
FIG. 9 is a schematic diagram (6) explaining the method of manufacturing the light emitting device according to the embodiment.

Besides, FIG. 9 illustrates an example of the case where the LED chip 101 and wire 121 are the coating targets Tg and the injection liquid 99 is sprayed onto the LED chip 101 and the wire 121 in the configuration of electrically connecting the electrodes of the LED chip 101 and the wiring electrodes of the substrate 102 together by wire 121.

As illustrated in FIG. 8 and FIG. 9, when the injection liquid 99 is sprayed onto the coating target Tg, the coating target Tg is coated with a necessary amount of the optical matter particles 91 contained in the injection liquid 99.

During the spray coating step S120, it is preferable to perform the pre-curing step of heating and pre-curing the binder contained in the slurry 93 (see FIG. 2) coated on the coating target Tg (S135). It is possible to perform the pre-curing step S135 by causing a not-illustrated heater built in the stage 21 to heat the slurry 93 together with the coating target Tg, for example. Alternatively, it is possible to perform the pre-curing step S135 by causing an oven provided outside the coating apparatus 3 to heat the slurry 93. The method of manufacturing the light emitting device 100 preferably includes the pre-curing step S135 if several layers are to be stacked by spray coating. The method of manufacturing the light emitting device 100 makes it possible to reduce the change in the shape of the slurry 93 due to trickling of the slurry 93 by pre-curing the slurry 93 coated at the pre-curing step S135 and overlaying a spray coating on that layer.

After that, the curing (heating) step is performed where the binder contained in the slurry 93 (see FIG. 2) coated on the coating target Tg is heated and cured (S150). As in the case of the pre-curing step S135, it is possible to perform this curing step S150 by causing a not-illustrated heater built in the stage 21 to heat the slurry 93 together with the coating target Tg, for example. Alternatively, it is possible to perform the curing step S150 by causing an oven provided outside the coating apparatus 3 to heat the slurry 93.

Figure 10:
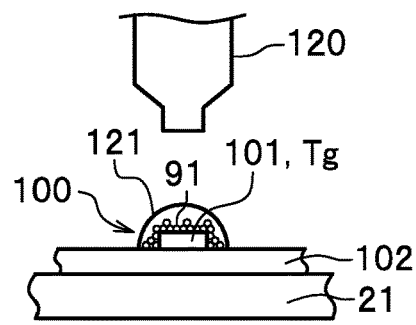
FIG. 10 is a schematic diagram (7) explaining the method of manufacturing the light emitting device according to the embodiment.

Note that if the slurry 93 contains no resin material or the slurry 93 contains a small amount of resin material, it is preferable to perform the translucent resin covering step of fixing and covering the LED chip 101 and the slurry 93 with a translucent resin 121 (see FIG. 10) after the spray coating is finished (S145). This makes it possible to fix an optical material around the LED chip 101. As illustrated in FIG. 10, the translucent resin covering step S145 is performed by coating the LED chip 101 with the translucent resin 121 by use of a covering apparatus 120 separately provided to the manufacture apparatus 1, and then curing the translucent resin by the same method as the curing step S150 described above, for example. It is possible to use a coating apparatus such as a spray apparatus and a potting apparatus as the covering apparatus 120. Thus, the translucent resin covering may be performed by the spray coating method or other coating methods such as the potting method.

As described above, the light emitting device 100 is manufactured.

The method of manufacturing the light emitting device 100 of the present embodiment further includes the following steps.

After the spray coating step S120, the controller 2 preferably performs the step of determining whether the coating is provided on the entire coating area on the substrate (S125). The processing proceeds to the stage moving step S130 as illustrated in FIG. 4 if it is determined at the determination step S125 that the coating is not provided on the entire coating area (in the case of "No"). In this case, the stage moving step is performed where the stage transfer mechanism 31 moves the stage 21 in the front-rear direction (direction of arrow Y2) by several millimeters (S130). After that, the processing returns to the spray coating step S120 again. As a result, the processes S120 to S130 are repeated until it is determined at the determination step S125 that the coating is provided on the entire coating area ("Yes"). This makes it possible for the coating apparatus 3 to uniformly coat the entire coating area of the coating target Tg with the injection liquid 99. In addition, the coating apparatus 3 can adjust the concentration of and the coating amount of the slurry to be coated on the light emitting device 100, and as a result can obtain a light emitting device 100 which has a color temperature property of the desired level.

Note that the timing when the support member 35 moves (the spray nozzle 34 moves) and the timing when the stage 21 moves may be reversed. In other words, the coating apparatus 3 may be configured to operate as follows. At the spray coating step S120, the support member 35 (spray nozzle 34) is stopped at a certain position. Meanwhile, the stage transfer mechanism 31 moves the stage 21 in the front-rear direction and the spray nozzle 34 sprays the slurry 93 as the injection liquid 99 (see FIG. 8) onto the coating target Tg. Then, at the stage moving step S130, the coating apparatus 3 may cause the not-illustrated support member transfer mechanism to move the spray nozzle 34 together with the support member 35 in the right-left direction by several millimeters.

For example, at the spray coating step S120, the spray nozzle 34 is stopped at a certain position. Meanwhile, the coating apparatus 3 causes the stage transfer mechanism 31 to move the stage 21 in the front-rear direction and causes the spray nozzle 34 to spray the slurry 93 as the injection liquid 99 (see FIG. 8) onto the coating target Tg. Then, at the stage moving step S130, the coating apparatus 3 causes the not-illustrated support member transfer mechanism to move the spray nozzle 34 together with the support member 35 in the right-left direction by several millimeters. The coating apparatus 3 may be configured to perform such operations.

The processing proceeds to the pre-curing step S135 if it is determined at the determination step S125 that the coating is provided on the entire coating area (in the case of "Yes"). In this case, after the pre-curing step S135, it is preferable for the controller 2 to perform the coating number determination step as to "whether the spray coating has reached N times" (S140). Here, "N times" means the predetermined number of times.

The processing returns to the spray coating step S120 if it is determined at the coating number determination step S140 that the spray coating has not reached N times (in the case of "No"). In this case, the coating apparatus 3 stops the stage 21. Meanwhile, the coating apparatus 3 causes the not-illustrated support member transfer mechanism to move the spray nozzle 34 together with the support member 35 and performs the second spray injection in the same manner as the first spray injection. The coating apparatus 3 repeats such operation until it reaches N times. Thus, the coating apparatus 3 provides a coating of the injection liquid 99 over the same line of the coating target Tg.

Then, the processing proceeds to the translucent resin covering step S145 if it is determined at the coating number determination step S140 that the spray coating has reached N times (in the case of "Yes").

The method of manufacturing such a light emitting device 100 according to the present embodiment includes, unlike the conventional one, causing the bubble producing unit 62 arranged inside the slurry tank 33 to stir the slurry 93 immediately before spray injection. For this reason, the method of manufacturing the light emitting device 100 according to the present embodiment can further improve the performance of stirring the slurry 93.

As described above, the method of manufacturing the light emitting device 100 according to the present embodiment makes it possible to improve the coating quality of the optical matter particles 91 to a high level to be required in the future because the method includes the spray coating step S120 in which the performance of stirring the slurry 93 is further improved by causing the bubble producing unit 62 arranged inside the slurry tank 33 to stir the slurry 93 immediately before spray injection.

Note that the disclosure is not limited to the embodiment described above, and is capable of various modifications and variations within the scope not departing from the gist of the disclosure.

For example, the aforementioned embodiment has been described in detail in order to facilitate understanding of the explanation of the gist of the disclosure. For this reason, the disclosure is not necessarily limited to an embodiment including all of the described components.

Moreover, the aforementioned embodiment has been described assuming that the optical matter particles 91 contained in the slurry 93 are made of fluorescent matter, for example. However, the optical matter particles 91 contained in the slurry 93 may be made of other optical matters including light reflecting matter and light diffusing matter such as, typically, titanium oxide, silicon oxide, or zinc oxide.

Furthermore, the aforementioned embodiment uses the spray injection mask 103, for example. However, the mask 103 does not necessarily have to be used.

What is more, the aforementioned embodiment has been described assuming that the coating target Tg is mounted on the substrate 102, for example. However, the configuration may be such that the coating target Tg is not mounted on the substrate 102. Therefore, the coating target Tg may be the LED chip 101 alone without the substrate 102 or a chip scale package (CSP), for example.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, comprising the steps of:
   storing slurry containing optical matter particles into a slurry tank;
   stirring the slurry inside the slurry tank by causing a bubble producing unit arranged below a liquid surface of the slurry to produce bubbles; and
   spraying the slurry onto a coating target including a light emitting element from a nozzle arranged above the coating target.

2. The method of manufacturing a light emitting device according to claim 1, wherein
   the step of stirring the slurry and the step of spraying are performed almost at a same time.

3. The method of manufacturing a light emitting device according to claim 1, wherein
   the bubbles are gas containing one or both of air and inactive gas.

4. The method of manufacturing a light emitting device according to claim 1, wherein
   the slurry contains volatile solvent and the bubbles contain gas of a material of the solvent.

5. The method of manufacturing a light emitting device according to claim 4, wherein
   vapor of the solvent contained in the bubbles dissolves into the slurry.

6. The method of manufacturing a light emitting device according to claim 1, wherein
   two of the slurry tanks are provided, and
   the slurry is sprayed from the nozzle provided at a middle portion of a connection member which connects the two slurry tanks while the slurry is being circulated via the connection member.

7. The method of manufacturing a light emitting device according to claim 1, wherein
   the slurry contains uncured thermosetting resin, and
   the method repeats the step of spraying and a step of pre-curing the sprayed thermosetting resin.

8. The method of manufacturing a light emitting device according to claim 1, wherein
   the optical matter particles contained in the slurry are made of one of fluorescent matter, light diffusing matter, and light reflective matter.

9. The method of manufacturing a light emitting device according to claim 1, wherein
   a viscosity of the slurry is 0.3 mPa·s to 1000 mPa·s, and
   a median particle diameter of the optical matter is 15±5 µm.

10. The method of manufacturing a light emitting device according to claim 1, wherein
    a volume of the bubbles produced is 0.1 to 100 times an internal volume of the tank or a volume of the slurry in the tank.

* * * * *